(12) United States Patent
Foster

(10) Patent No.: US 9,357,684 B2
(45) Date of Patent: May 31, 2016

(54) SPRING ASSEMBLIES WITH SPRING ENERGIZED SEAL MEMBERS AND RELATED METHODS

(71) Applicant: Bal Seal Engineering, Inc., Foothill Ranch, CA (US)

(72) Inventor: Mike Foster, Foothill Ranch, CA (US)

(73) Assignee: Bal Seal Engineering, Inc., Foothill Ranch, CA (US)

( * ) Notice: Subject to any disclaimer, the term of this patent is extended or adjusted under 35 U.S.C. 154(b) by 0 days.

(21) Appl. No.: 14/494,913

(22) Filed: Sep. 24, 2014

(65) Prior Publication Data

US 2015/0083481 A1    Mar. 26, 2015

Related U.S. Application Data

(60) Provisional application No. 61/881,582, filed on Sep. 24, 2013.

(51) Int. Cl.
| | |
|---|---|
| *H05K 9/00* | (2006.01) |
| *F16J 15/06* | (2006.01) |
| *F16J 15/32* | (2016.01) |

(52) U.S. Cl.
CPC ............ *H05K 9/0081* (2013.01); *F16J 15/061* (2013.01); *F16J 15/3212* (2013.01); *F16J 15/3236* (2013.01); *H05K 9/0015* (2013.01); *Y10T 29/49826* (2015.01)

(58) Field of Classification Search
CPC .. H05K 9/0015; F16J 15/3212; F16J 15/3236
See application file for complete search history.

(56) References Cited

U.S. PATENT DOCUMENTS

| | | | |
|---|---|---|---|
| 2,825,590 A | 3/1958 | Sutherland | |
| 4,268,045 A | 5/1981 | Traub | |
| 4,934,666 A * | 6/1990 | Balsells | ................. F16F 1/045 |
| | | | 174/366 |
| 5,163,692 A | 11/1992 | Schofield et al. | |
| 5,265,890 A | 11/1993 | Balsells | |
| 6,173,964 B1 | 1/2001 | Bell et al. | |
| 7,344,140 B2 | 3/2008 | Ikeda | |
| 8,328,202 B2 | 12/2012 | Foster et al. | |
| 2002/0014747 A1 | 2/2002 | Yamada et al. | |
| 2005/0093246 A1 | 5/2005 | Dietle et al. | |
| 2005/0206097 A1* | 9/2005 | Datta | ................... F16J 15/3212 |
| | | | 277/644 |
| 2009/0146379 A1* | 6/2009 | Foster | ................. F16J 15/3236 |
| | | | 277/307 |

(Continued)

FOREIGN PATENT DOCUMENTS

| | | |
|---|---|---|
| DE | 2239387 | 2/1974 |
| EP | 0496389 | 7/1992 |

(Continued)

OTHER PUBLICATIONS

Extended European Search Report from European Patent Office on co-pending EP application (EP14186231.8) dated Mar. 25, 2015.

*Primary Examiner* — Hung V Ngo

(74) *Attorney, Agent, or Firm* — Klein, O'Neill & Singh, LLP

(57) ABSTRACT

Seal assemblies in which a seal member having an energizer located in a seal body groove is positioned inside a housing cavity of a housing are disclosed. The sealing member and the energizer, which can be an O-ring or a spring energizer, can be retained inside the housing cavity by positioning a portion of the energizer in a groove in the housing cavity in a locking or latching engagement. Methods of making and using seal assemblies are also disclosed.

24 Claims, 6 Drawing Sheets

(56) References Cited

U.S. PATENT DOCUMENTS

| | | | | |
|---|---|---|---|---|
| 2009/0289418 A1* | 11/2009 | Cook | F16J 15/3212 | 277/309 |
| 2010/0044972 A1* | 2/2010 | Vila | F16J 15/3212 | 277/612 |
| 2010/0102518 A1* | 4/2010 | Gao | F16J 15/164 | 277/554 |
| 2011/0079962 A1* | 4/2011 | Munro | F16J 15/3212 | 277/500 |
| 2012/0104701 A1* | 5/2012 | Bertini | F16J 15/3212 | 277/573 |
| 2013/0043660 A1* | 2/2013 | Daub | F16J 5/3212 | 277/500 |

FOREIGN PATENT DOCUMENTS

| | | |
|---|---|---|
| EP | 1323958 | 7/2003 |
| EP | 1598579 | 11/2005 |
| GB | 1066857 | 4/1967 |
| WO | WO 2007/055156 | 5/2007 |
| WO | WO 2007/119112 | 10/2007 |
| WO | WO 2009/041877 | 4/2009 |

* cited by examiner

SPRING ASSEMBLIES WITH SPRING ENERGIZED SEAL MEMBERS AND RELATED METHODS

FIELD OF ART

Seal assemblies with seal members for sealing are generally discussed herein with particular discussions on spring energized face seals located inside assembly housings and related methods.

BACKGROUND

Conventional face seals are currently most often used in the industry for static applications with sealing surfaces that are normal to the axis of the seal, which is generally at the center of the bore of the seal. Typically, a face seal involves placing the seal in an open cavity and adding hardware such as a retaining pin or a clip to retain the seal. Such installment of additional hardware can increase costs and cause complications in the assembly. Additional complications that may arise are manufactured part tolerance issues between the sealing component and the housing and seal vibration. Furthermore, as extreme temperature changes occur, the sealing component may experience shrinkage. These factors may cause the sealing component to become loose in the assembly, incorrectly positioned, and result in seal failure.

SUMMARY

The present systems, devices, and methods resolve the mentioned complications by providing a spring energizer within the sealing component that can retain itself within a groove in a cavity of a housing. The retaining function accomplished by the spring energizer results in a seal assembly with minimal parts by not utilizing additional hardware to keep the seal assembly in place, although additional hardware may be used. In addition, usage of spring energizer as a means of retention can accommodate for a wider tolerance range, thermal effects, and vibration due to the spring energizer's ability to deflect.

Seal assemblies introduced herein comprise a sealing component, a housing, and a spring energizer wherein the sealing component comprises a spring cavity in which the spring energizer is inserted. The spring energizer is used to retain, by means of a latch or lock, the sealing component within a cavity of the housing. The retention is accomplished by a portion of the spring energizer entering into a groove in the cavity of the housing. Such design allows the seal assembly to comprise of fewer components as well as have the ability to stay assembled with wider tolerances, thermal effects, or during vibration. In other examples, the spring is biased against the housing cavity and is retained in the cavity using a holding force.

Aspects of the present disclosure further include a seal assembly having a bore comprising a sealing member, an energizer, and a housing having sidewalls defining, at least in part, a housing cavity; the sealing member is retained in the housing cavity and the sealing member comprises a seal cavity in which the energizer is located; and a groove formed in the housing cavity having a portion of the energizer located in the groove to retain the sealing member in the housing cavity.

The seal assembly wherein the sealing member can comprise a seal body comprising a bore and wherein the sealing member can be a face seal comprising an inside flange and an outside flange pointing in a direction of the bore of the seal body or in a direction away from the bore of seal body.

The seal assembly wherein the groove can be formed on one of the sidewalls and wherein the groove can be a V-bottom groove.

The seal assembly wherein the energizer can be an annular helical spring, a garter spring, a ribbon spring, a canted coil spring or an O-ring.

The seal assembly wherein the energizer can be an axially or a radially oriented canted coil spring.

The seal assembly wherein the groove can be located on an inside sidewall defining at least part of the bore of the seal assembly.

The seal assembly wherein the groove can form a latch or a lock with the energizer.

The seal assembly wherein at least a portion of the sealing member can be loaded by the energizer against a surface of the housing cavity.

The seal assembly wherein the sealing member can comprise a seal lip that is energized by the energizer.

The seal assembly wherein an entry chamfer for the energizer to rotate can be on a same side as the groove.

The seal assembly whereby the energizer can be rotated to move the energizer deeper into the spring cavity of the sealing member to allow for full insertion of the sealing member into the housing cavity.

The seal assembly can further comprise a second sealing member having a second energizer located in a seal body cavity and wherein the energizer can engage a second groove in the housing cavity.

A still further aspect of the present disclosure is a method of assembling a face seal assembly. The method can comprise providing a sealing member, an energizer, and a housing having sidewalls defining, at least in part, a housing cavity; inserting the energizer into a seal body cavity of the sealing member; inserting the sealing member with the energizer into the housing cavity; and retaining the sealing member in the housing cavity by positioning a portion of the energizer within a groove formed in the housing cavity.

The method wherein the sealing member can be a face seal comprising an inside flange pointing in a direction of a bore or in a direction away from the bore.

The method wherein the groove can embody a V-bottom groove.

The method wherein the energizer can be an annular helical spring, a garter spring, a ribbon spring, an O-ring, or a canted coil spring.

The method wherein the energizer can be an axially or a radially oriented canted coil spring.

The method wherein the groove can be located on a sidewall of the housing cavity closer to a bore than a sidewall further away from the bore.

The method wherein the energizer can be held in the groove in a latch or lock configuration.

The method wherein at least a portion of the sealing member can be loaded by the energizer against a housing cavity surface.

The method wherein the sealing member can comprise a seal lip that is energized by the energizer.

The method wherein the housing cavity can comprise an entry chamfer to allow the energizer to rotate, deflect, and move deeper into the seal body cavity.

The method whereby the energizer can move deeper into the seal body cavity to allow for full insertion of the sealing member into the housing cavity.

The method can further comprise a second sealing member having a second energizer located in a seal body groove and wherein the energizer can engage a second groove in the housing cavity.

Aspects of the present disclosure further include a seal assembly having a bore comprising a sealing member, a spring energizer, and a housing having sidewalls defining, at least in part, a housing cavity; the sealing member is retained in the housing cavity and the sealing member comprises a spring cavity in which the spring energizer is located; and a groove on an inner surface of one of the sidewalls of the housing having a portion of the spring energizer located therein to retain the sealing member in the housing cavity.

The seal assembly wherein the sealing member can include a seal body comprising a bore and wherein the sealing member can be a face seal comprising an inside flange and an outside flange pointing in a direction of the bore of the seal body or in a direction away from the bore of the seal body.

The seal assembly wherein the groove on the inner surface of one of the sidewalls can be a V-bottom groove.

The seal assembly wherein the spring energizer can be an annular helical spring, a garter spring, or a canted coil spring.

The seal assembly wherein the spring energizer can be an axially or a radially oriented canted coil spring.

The seal assembly wherein the sidewall with the groove can be an inside sidewall defining at least part of the bore of the seal assembly.

The seal assembly wherein the groove can form a latch or a lock with the spring energizer.

The seal assembly wherein a portion of the sealing member can be loaded by the spring energizer against a surface of the housing cavity.

The seal assembly wherein the sealing member can comprise a seal lip that is energized by the spring energizer.

The seal assembly wherein the sidewall with the groove can comprise an entry chamfer for the spring energizer to rotate.

The seal assembly whereby the spring energizer can rotate to move the spring energizer deeper into the spring cavity of the sealing member to allow for full insertion of the sealing member into the housing cavity.

The seal assembly whereby the sealing member can be fully inserted into the housing cavity to cause a portion of the spring energizer to enter the groove in the housing cavity.

The seal assembly can further comprise a second sealing member having a second spring energizer located in a spring groove and wherein the spring can engage a second groove in the housing cavity.

Further aspects of the present disclosure can include a method of assembling a face seal assembly. The method for assembly can comprise providing a sealing member, a spring energizer, and a housing having sidewalls defining, at least in part, a housing cavity; inserting the spring energizer into a spring cavity of the sealing member; inserting the sealing member into the housing cavity; and retaining the sealing member in the housing cavity by positioning a portion of the spring energizer within a groove on a surface of the housing cavity.

The method wherein the sealing member can be a face seal comprising an inside flange pointing in a direction of a bore or away from the bore.

The method wherein the groove can be a V-bottom groove.

The method wherein the spring energizer can be an annular helical spring, a garter spring, or a canted coil spring.

The method wherein the spring energizer can be an axially or a radially oriented canted coil spring.

The method wherein the groove can be on a sidewall of the cavity closer to a bore than a sidewall further away from the bore.

The method wherein the spring energizer can be held in the groove in a latch or lock configuration.

The method wherein a portion of the sealing member can be loaded by the spring energizer against a cavity surface.

The method wherein the sealing member can comprise a seal lip energized by the spring energizer.

The method wherein the housing cavity can comprise an entry chamfer to allow the spring energizer to rotate, deflect, and move deeper into the spring cavity.

The method whereby the spring energizer can move deeper into the spring cavity to allow for full insertion of the sealing member into the housing cavity.

The method whereby the sealing member can be fully inserted into the housing cavity to allow a portion of the spring energizer to enter the groove in the cavity.

The method can further comprise a second sealing member having a second spring energizer located in a spring groove and wherein the spring energizer can engage a second groove in the housing cavity A yet further aspect of the present disclosure is a method for making a seal assembly having a bore comprising the steps: providing a sealing member with a spring cavity; placing a spring energizer into the spring cavity; and providing a housing having sidewalls defining, at least in part, a housing cavity; placing the sealing member in the housing cavity; and positioning at least part of the spring energizer in a groove on an inner surface of one of the sidewalls of the housing to retain the sealing member in the housing cavity.

BRIEF DESCRIPTION OF THE DRAWINGS

These and other features and advantages of the present devices, systems, and methods will become appreciated as the same becomes better understood with reference to the specification, claims and appended drawings wherein:

DETAILED DESCRIPTION

Figure 1:
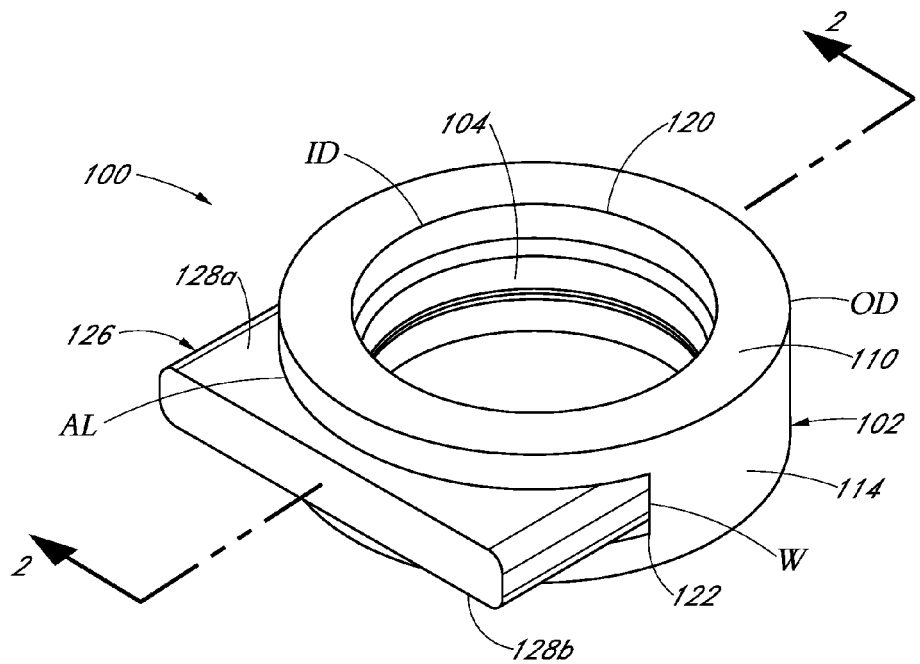
FIG. 1 shows a self-retaining seal assembly in a double seal application.

The detailed description set forth below in connection with the appended drawings is intended as a description of the presently preferred embodiments of seal assemblies having spring energized seal members provided in accordance with aspects of the present devices, systems, and methods and is not intended to represent the only forms in which the present devices, systems, and methods may be constructed or utilized. The description sets forth the features and the steps for constructing and using the embodiments of the present devices, systems, and methods in connection with the illustrated embodiments. It is to be understood, however, that the same or equivalent functions and structures may be accomplished by different embodiments that are also intended to be encompassed within the spirit and scope of the present disclosure. As denoted elsewhere herein, like element numbers are intended to indicate like or similar elements or features.

Figure ("FIG." or "Fig.") 1 shows a seal assembly 100 provided in accordance with aspects of the present disclosure. As shown, the seal assembly 100 comprises an assembly body 102 comprising a bore 104 for receiving a pin, a shaft, or a rod, which may be considered similar unless the context indicates otherwise. The assembly body 102, which may also be referred to as a housing, further comprises a holding cavity 142 (FIG. 2) for retaining or accommodating two seal members, such as two face seals 106, 108 (FIG. 2), each with a bore that aligns with the bore of the assembly body 102. In some examples, the seal members 106, 108 can be O-rings or spring energized O-rings. Further, while two seal members 106, 108 are shown, aspects of the present disclosure contemplate using a housing 102 comprising only one cavity chamber, such as a single housing cavity, for receiving only one seal member or structured housing cavity for receiving more than two sealing members. Still further, while the seal members disclosed herein are readily understood as providing a sealing function, they can also provide EMI shielding. As presently understood, spring energizers are known to provide effective EMI shielding. Thus, use of a spring energizer inside a seal body can provide both a sealing function and an EMI shielding function.

The assembly body 102 is generally cylindrical and comprises a first end surface 110, an opposed second end surface 112, and a side wall 114 located therebetween. The two end surfaces 110, 112 each has an outside diameter OD and an inside diameter ID defining an opening 120 having the bore 104 extending therebetween. In one example, the assembly body 102 is formed by molding, casting, machining, or combinations thereof. The assembly body 102 may be made from a hard plastic material, such as engineered plastic like PEEK, or from a metal material, such as, steel, stainless steel or an alloy. The inside and outside diameters as well as the sidewall length or dimension of the assembly body 102 can vary depending on the particular application, such as for use with a large diameter shaft as opposed to a relatively smaller diameter shaft. As shown, a cut-out 122 is provided along an arc length of the sidewall 114. The cut-out 122 may also be referred to as a channel or a notch comprising a width W and an arc-length AL sized and shaped to receive an insert component 126 having a width and a depth. Further aspects of the insert component 126 are discussed below with reference to FIG. 3. Once inserted into the notch 122 and into a holding cavity of the assembly body, the two seal members 106, 108 seal against opposed surfaces of the insert component 126, which is more clearly shown in cross-section in FIG. 2. In other examples, the assembly body or housing 102 does not incorporate a notch or cut-out and does not accept an insert component. Instead, the housing 102 can be connected to other equipment components at the two end surfaces and a shaft projects through the bore of the sealing member(s) and the housing without a separate insert component.

Figure 2:
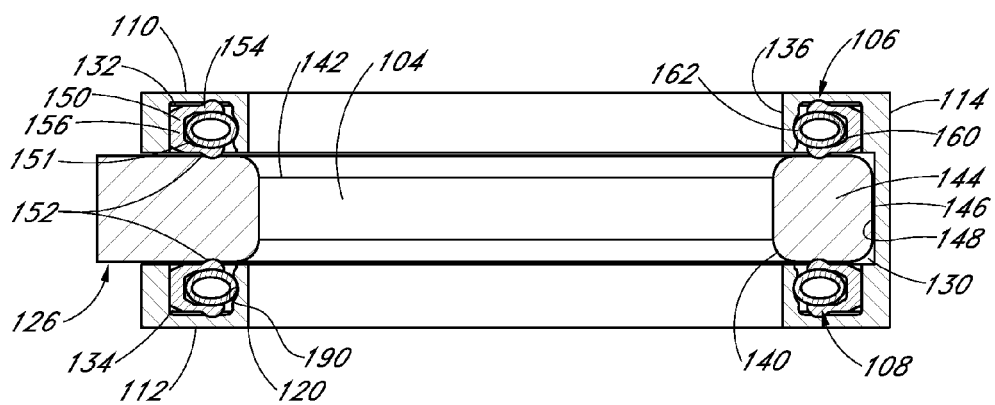
FIG. 2 shows a cross-sectional view of the seal assembly of FIG. 1 taken along line 2-2.

With reference now to FIG. 2, which is a cross-section of FIG. 1 taken along line 2-2, two seal members 106, 108 are used to seal against first and second surfaces 128a, 128b of the insert component 126. In the particular example shown, the two seal members are face seals 106, 108 configured to seal against surfaces that are general orthogonal to the lengthwise axis of bore 104. The face seals are shown positioned in a housing cavity 130 of the assembly body 102, along a first cavity chamber 132 and a second cavity chamber 134 and sealing against the first and second surfaces 128a, 128b of the insert component 126. Each chamber is defined by part of the sidewall 114 and a respective end wall 110 or 112 of the assembly body 102. Additionally, each chamber 132 or 134 is defined by an inside sidewall 136 or 138 and wherein the two inside sidewalls 136, 138 are spaced from one another by a gap 140, which is of sufficient dimension for accommodating or receiving the insert component 126. The gap 140 between the two inside sidewalls 136, 138 and the interior of the assembly body define a holding space 142 for the insert component 126. As shown, the insert end 144 is pushed into the holding space 142 so that the end surface 146 of the insert end touches the interior sidewall surface 148. However, in other embodiments, the end surface 146 does not touch the interior sidewall surface. In an example, a chamfer 194 (FIG. 4A) is incorporated at an entry to the cavity chamber 132, 134 of each of the two cavity chambers to allow the spring energizer 162 to rotate and move deeper into the spring groove 160 of the respective elastic seal body 150 as the seal member 106 or 108 is inserted into the respective cavity chamber 132 or 134. Movement of the spring energizer 162 deeper into the spring cavity 160 of the elastic body allows for full insertion of the sealing member 106 or 108 into the cavity 132 or 134 of the assembly body 102. For example, when the spring energizer 162 does not sit sufficiently deep in the spring cavity 160 of the seal body 150, the spring energizer can hit or be obstructed by the inside side wall of the housing cavity, such as near the chamfer 194. Thus, movement of the spring energizer can facilitate insertion of the seal assembly into the housing cavity.

The face seals 106, 108 each comprises a seal body 150 made from an elastic material and comprises an inside flange 152, an outside flange 154, and a center channel section 156 extending therebetween, which collectively define a spring groove 160 having a spring energizer 162 located therein. The spring groove 160 may alternatively be referred to as a spring cavity. The inside flange 152 can have a seal lip that projects radially outwardly from the surface of the inside flange. In an example, the seal lip is a raised portion of the inside flange that differs from a nominal inside flange section. Similarly, the outside flange 154 can have a seal lip to seal against an interior surface of the seal body or housing cavity 130, such as to seal against an interior surface of the housing cavity. In some examples, the spring energizer 162 can be an annular helical spring, a garter spring, a canted coil spring, a ribbon spring, or a V-spring. For a canted coil spring, the spring can be an axially or a radially oriented canted coil spring. The elastic material may be any number of elastomer, thermoplastic elastomer, or a polymer material, for example PTF and PTFE. The canted coil spring 162 biases the inside and outside flanges away from one another so that they press and seal against the insert component 126 and an interior surface of the housing cavity 130, such as the cavity chamber 132 when viewing the upper housing section of FIG. 2. As shown, the inside flange 152 and outside 154 flange point in the direction of the bore 104, which may be referred to as an inside configuration. In other examples, the inside flange 152 and outside flange 154 point away from the bore 104, which may be referred to as an outside configuration. In exemplary embodiments, the face seals have flanges that point in the direction of positive pressure. Thus, as shown in FIG. 2, the seal assembly 100 is configured for an application in which positive pressure is contained within the bore 104. In other examples, when the inside and outside flanges 152, 154 have an outside configuration, the pressure contained within the bore 104 is lower than the pressure outside the bore. The lower pressure can also be negative pressure, such as a vacuum.

As further discussed below with reference to FIGS. 4 and 4A, the interior of the inside side surface 136 of the cavity 130 of the assembly body 102 may be flat or may incorporate a groove 190. In other words, the housing has sidewalls that define a housing cavity and wherein a groove can be provided inside the housing cavity. If the seal assembly is an outside configuration, then the location of the groove can change, such as being located at on the outside sidewall. If the cavity has a flat surface, the spring element 162 of the face seal is configured to push against the flat surface to retain the face seal in the cavity chamber 132 or 134 by way of a holding force. If a groove 190 is incorporated in the housing cavity as shown, then the spring element 162 of the face seal interacts with the groove, such as received by the groove, to retain the face seal in the cavity chamber 132 or 134 using latching or locking. In a latching arrangement, the spring can separate from the groove. In a locking arrangement, the spring cannot separate from the groove without destroying the spring and/or the elastic member of the seal body. In an example, the groove 190 is a V-bottom groove. In another example, the V-bottom groove has a flat surface located between two slanted surfaces. In still other examples, the groove 190 has a bottom wall located between two generally parallel sidewalls. Other groove geometries are contemplated. Upon full insertion of the sealing member 106, or 108 into the respective cavity chamber 132 or 134 of the housing 102, the spring energizer is allowed to enter the groove 190 in the cavity 130. The seal members disclosed herein, because they incorporate energizers or spring energizers that engage a groove, can also be understood or referred to as latchable seals or latchable seal members.

The tolerance between the seal body 150, the spring energizer 162, the cavity 130, 132 or 134, and the groove can be wider in range due to the allowable deflection of the spring energizer. In other words, when an O-ring or a ribbon spring is used with a seal body, the tolerance between the cavity chamber 132 or 134 and the face seal can be relative small as the working range of the O-ring and ribbon spring is narrower than when a canted coil spring is used due to the larger working deflection range for the canted coil spring. Thus, shrinkage of the sealing component 150 under extreme temperatures, such as low or below freezing point, may not cause major problems to the sealing abilities of the disclosed face seals 106, 108 against the surfaces 128a, 128b of the insert component 126 due to the large working deflection range of the disclosed seal members.

Figure 3:
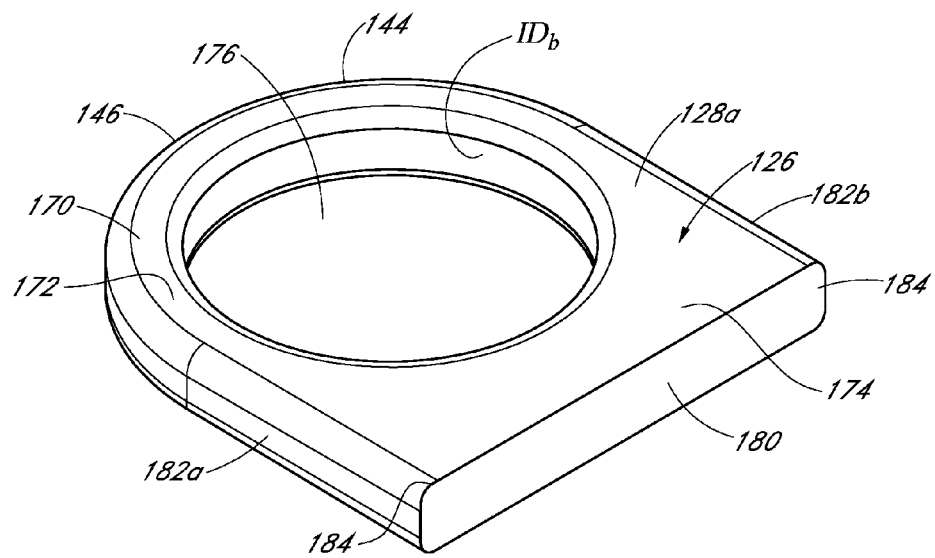
FIG. 3 shows a perspective view of the insert component of FIG. 1.

With reference now to FIG. 3, a perspective view of the insert component 126 of FIGS. 1 and 2 is shown. As shown, the insert component 126 has an insert body 170 comprising a first section 172 and a second section 174. The first section 172 is generally round and is sized and shaped to generally align with the shape or configuration of the assembly body 102. The second section 174 may have the same shape or configuration as the first section 172 but is typically different since portions of the second section 174 do not enter the holding space 142 of the assembly body 102. In an example, the first section 172 has a perimeter that together with the perimeter of the second section 174 define a bore 176. The bore 176 has in inside diameter $ID_b$ that is smaller than the inside diameter ID of the assembly body 102. In other examples, the inside diameter $ID_b$ of the bore 176 of the insert component 126 is equal to or larger than the inside diameter ID of the assembly body 102. In an example, the insert component 126 is sized and shaped so that the central axis of the bore 176 generally aligns with the central axis of the bore 104 of the assembly body 102 when the insert component is placed inside the holding space 142.

As shown, the first section 172 has an arcuate end surface 146 while the second section 174 has a generally flat linear end surface 180. The side surfaces 182a, 182b are generally linear or straight and the distance between the two side surfaces 182a, 182b is about the same as the outside diameter of the first section 172. The corners 184 of the first section 174 and sections proximate thereto, such as the two sides 182a, 182b may be used to grab and manipulate the insert component 126. The insert component 126 may be made from a hard plastic material, such as engineered plastic like PEEK, or from a metal material, such as steel, stainless steel or an alloy.

Once the seal members are located in the housing cavity, no additional hardware is required to retain the seal members, although a fastener, a detent, or a clip may be used. The retention is achieved by a spring energizer 162 contacting an interior surface of the housing cavity, which can be a radial canted coil spring, located within a spring cavity of the sealing member, such as the face seals 106, 108 of FIG. 2. The insert component can also be held within the holding space without the use of additional hardware. The biasing force generated by the springs holds the insert component within the holding space.

Figure 4:
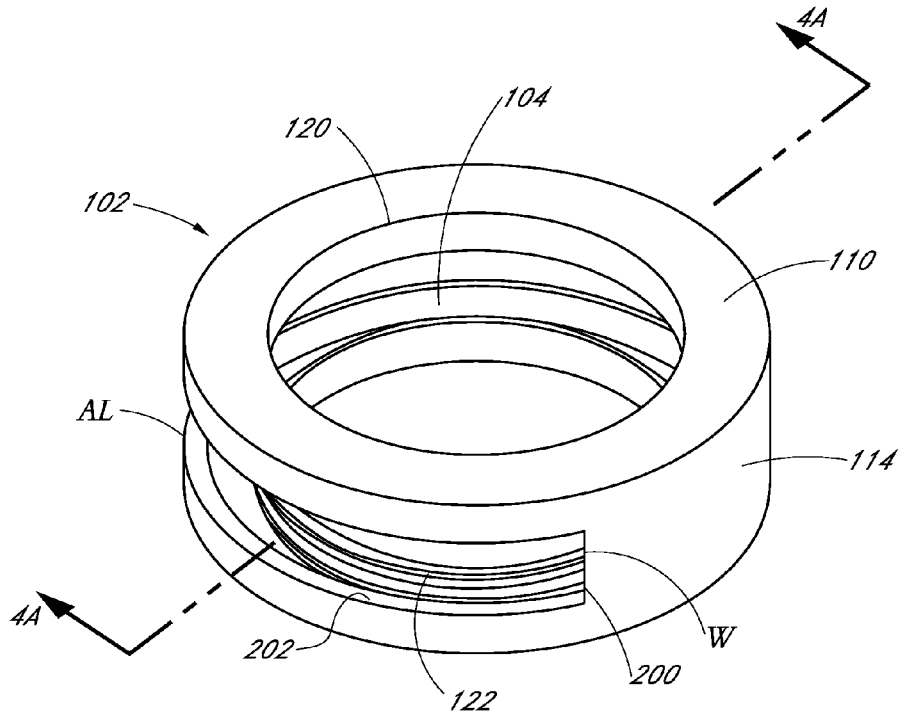
FIG. 4 shows a perspective view of the housing of FIG. 1.
Figure 4A:
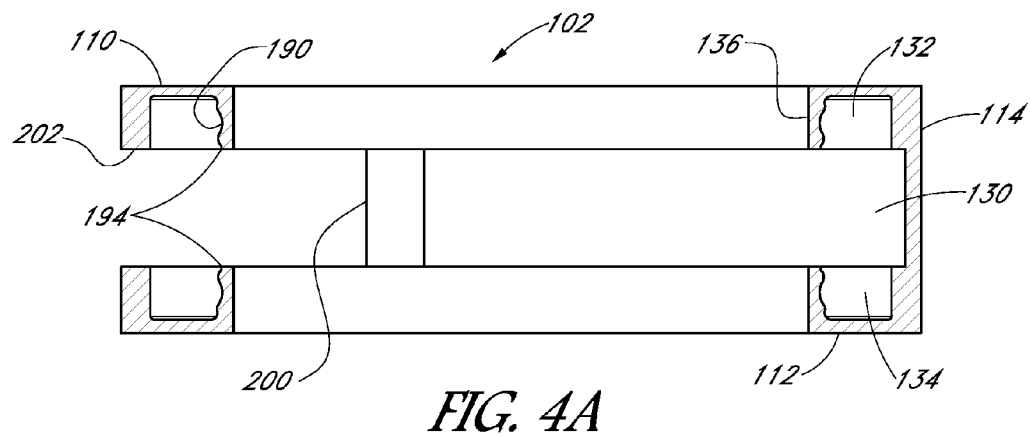
FIG. 4A shows a cross-sectional view of the housing of FIG. 4 taken along line 4A-4A.

FIG. 4 shows the assembly body 102 of FIG. 1 without the insert component 126 and without the two seal members 106, 108 and FIG. 4A is a cross-section of the assembly body 102 of FIG. 4 take along line 4A-4A. As shown, the notch or cut-out 122 has a width W and an arc-length AL, as previously discussed, formed on the sidewall 114 between two end surfaces 110, 112 of the cylindrical shaped assembly body 102, which has a bore 104 formed between two openings 120 of the two end surfaces 110, 112. The cut-out 122 has at least two axial edges 200 that align generally axially with the lengthwise axis of the bore 104 and has at least two radial edges 202 that are formed radially of the lengthwise axis of the bore 104. The area bounded by the axial edges 200 and the radial edges 202 define the cut-out or notch 122 for receiving the insert component 126.

With reference specifically to FIG. 4A, the grooves 190 within the cavity 130 of the assembly body 102 for accommodating two seal members are shown. The cavity 130 has two cavity chambers 132, 134 for retaining two seal assemblies. As shown, the assembly body 102 is provided with a self-retaining ability to retain the two seal assemblies within the housing cavity 130 without external tools. In an example, the self-retaining ability embodies a groove 190 formed at each cavity chamber 132, 134 to interact with a spring element to retain a seal member therein. For example, the geometry of the groove 190 can be configured to provide a hold, a latch, or a locking arrangement with a spring element. In some examples, the groove 190 can be a V-bottom groove as shown in FIG. 4A. The groove 190 functions to retain the spring energizer 162 so that the sealing members 106, 108 are retained within the cavity 130 of the housing 102, and in particular within the cavity chambers 132, 134 of the housing. The seal members 106, 108, such as the face seals shown in FIG. 2, securely seal against first and second surfaces 128a, 128b of the insert element 126 without the need of additional hardware, such as clips or retaining pins.

Figure 5:
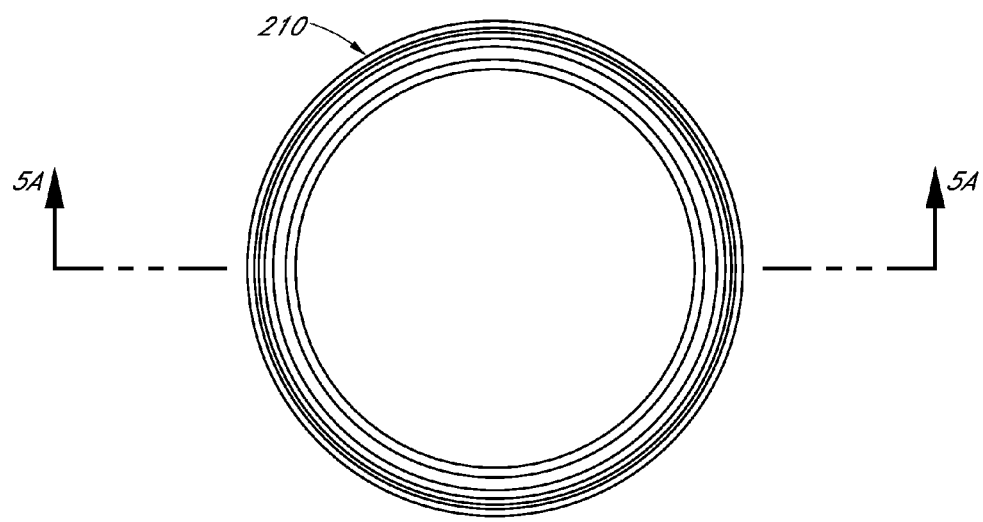
FIG. 5 is an end view or full embodiment of a spring energized face seal.
Figure 5A:
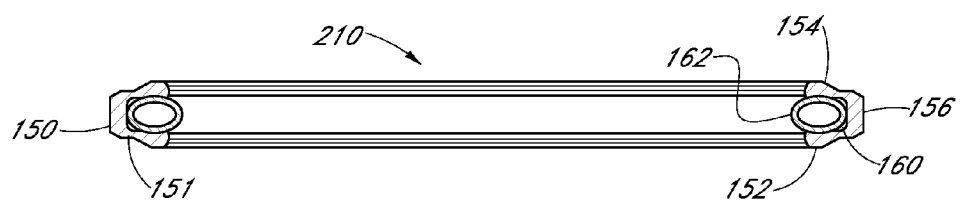
FIG. 5A shows a cross-sectional view of the spring energized face seal of FIG. 5 taken along line 5A-5A.

FIG. 5 is an end view of a seal member 210 and FIG. 5A shows a cross-section of the seal member of FIG. 5 taken along line 5A-5A. The seal member 210, which can be similar to the seal members 106, 108 described with reference to FIG. 2, has a spring cavity or spring groove 160 whereby a spring energizer 162 is retained therein and energizes the sealing member 210 against sealing surfaces at the inside flange 152 and at the outside flange 154 of the seal body 150. The spring energizer 162 in FIG. 5A is an axially oriented canted coil spring wherein the axial orientation helps to lock or latch the spring member 162 into the groove 190 in the cavity 130 in the housing 102.

Figure 6:
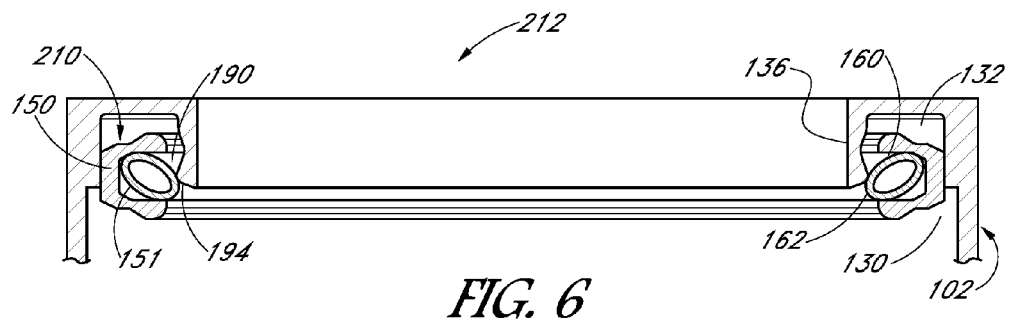
FIG. 6 shows a cross-sectional view of the insertion of a sealing component into a housing cavity of a housing.

FIG. 6 shows a method of assembly 212 provided in accordance with aspects of the present disclosure. In particular, the spring energized seal member 210 is placed into the housing 102 whereby during the insertion of the seal or sealing member 210 into the cavity 130 of the housing 102, and in particular into the cavity chamber 132 of the housing, the spring energizer 162 rotates and deflects within the seal body 150 to allow full insertion of the sealing member 210 into the cavity 130 of the housing 102 and to insert a portion of the spring energizer 162 to enter the groove 190 in the cavity chamber 132. In addition, a chamfer 194 may be located on a corner of an inside sidewall where the groove 190 is located to facilitate the rotation and deflection of the spring energizer 162 upon insertion, though a chamfer is not necessary for the insertion and rotation to occur. The rotation and deflection of the spring energizer 162 causes the spring energizer to move deeper into the spring groove 160 and thus allows the seal member 210 to be fully inserted into the cavity chamber 132 and have the seal member 210 fully secured therein.

A yet further aspect of the present disclosure is a method for making a seal assembly having a bore comprising the steps: providing a sealing member with a spring cavity; placing a spring energizer into the spring cavity; and providing a housing having sidewalls defining, at least in part, a housing cavity; placing the sealing member in the housing cavity; and positioning at least part of the spring energizer in a groove on an inner surface of one of the sidewalls of the housing to retain the sealing member in the housing cavity. Various other aspects for making the seal assembly can be incorporated as disclosed elsewhere herein.

For other seal assemblies and seal assembly components disclosed herein below, such as for other seal members and housings with housing cavities, it is understood that where a feature is shown but not expressly described and is otherwise the same or similar to the feature or features described elsewhere, such as above with reference to FIGS. 1, 2 and 5A, the disclosed part or parts shown in the subsequent drawing figures but not expressly described because of redundancy and because knowledge is built on a foundation laid by earlier disclosures may nonetheless be understood to be described or taught by the same or similar features expressly set forth in the text for the embodiments in which the feature or features are described, such as for the seal assembly of FIGS. 1 and 2. Said differently, subsequent disclosures of the present application are built upon the foundation of earlier disclosures unless the context indicates otherwise. The disclosure is therefore understood to teach a person of ordinary skill in the art the disclosed embodiments and the features of the disclosed embodiments without having to repeat similar components and features in all embodiments since a skilled artisan would not disregard similar structural features having just read about them in several preceding paragraphs nor ignore knowledge gained from earlier descriptions set forth in the same specification. As such, the same or similar features shown in the following seal assemblies incorporate the teachings of earlier embodiments unless the context indicates otherwise. Therefore, it is contemplated that later disclosed embodiments enjoy the benefit of earlier expressly described embodiments, such as features and structures of earlier described embodiments, unless the context indicates otherwise.

Figure 7:
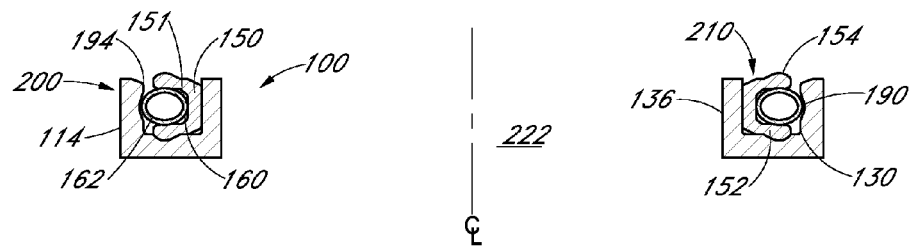
FIG. 7 is a cross-sectional side view of an alternative seal assembly provided in accordance with aspects of the present disclosure.

With reference now to FIG. 7, an alternative seal assembly 100 comprising a seal member 210 located inside a housing cavity 130 of a housing 220 is shown. The seal member 210 is similar to the seal member of FIG. 6 except wherein the seal member of FIG. 6 is a face seal with an inside configuration, the present face seal has an outside configuration in which the inside flange 152 and the outside flange 154 of the seal body 150 both point away from the bore 222 of the seal assembly. The seal member 210 of the present embodiment is a latchable seal in that an energizer is provided to engage a groove in a housing cavity, as further discussed below.

The housing 220 is generally U-shape in cross-section having an inside sidewall 136 and an outside sidewall 114. In the present embodiment, the housing cavity 130 has a groove 190 for mating with an energizer 162 located inside a seal cavity or groove 160 of the seal body 150. The groove 190 is located on an inside surface of the outside sidewall 114. The groove 190 may be similar to the grooves discussed elsewhere herein for engaging the energizer 162. To facilitate movement and rotation of the energizer 162 deeper into the seal cavity 160 of the seal body, a chamfer 194 is incorporated near the open end of the outside sidewall 114.

Figure 8A:
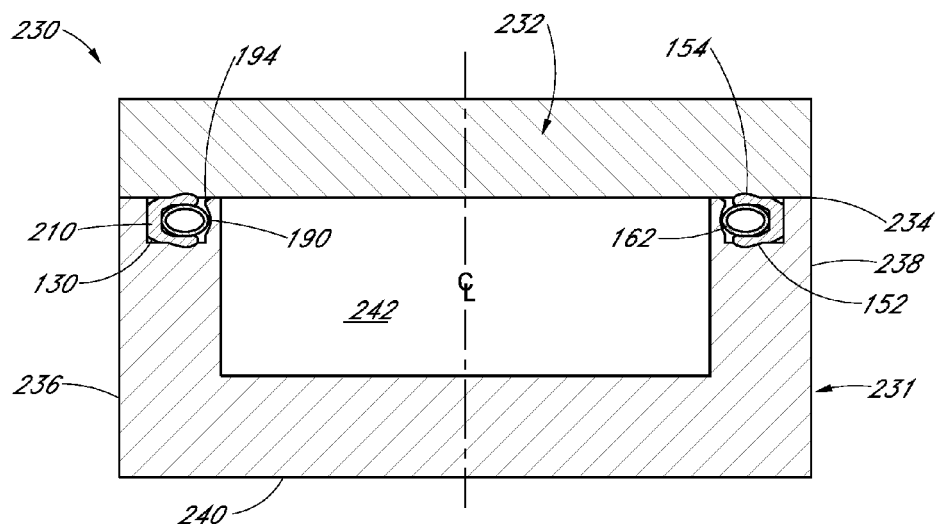
FIGS. 8A and 8B show cross-sectional views, respectively, of an equipment chamber having a base and a top in a closed position and an open position.

With reference now to FIG. 8A, an equipment chamber 230 is shown comprising a base 231 and a top 232 sealed to one another along a seam 234 by a seal member 210, which can be similar to the seal member shown with reference to FIG. 6. The seal member 210 of the present embodiment is a latchable seal in that an energizer is provided to engage a groove in a housing cavity, as further discussed below. In the present sealed chamber 230, the base 231 comprises a plurality of walls 236, 238, 240 defining a cavity 242. The walls 236, 238 are provided with a housing cavity 130 having the seal member 210 positioned therein for sealing the interface between the base 231 and the top 232, such as to provide a seal at the seam 234. In a particular example, the seal member 210 is a face seal having a spring energizer 162 located in a spring cavity and biasing the inside flange 152 against an interior surface of the housing cavity and the outside flange 154 against a surface of the top 232 to push the respective seal lips of the two flanges in sealing communication with the respective surfaces. A separate fastener, clamp, or strap can be used to hold the top 232 to the base 231 in the sealed configuration shown.

Also shown in FIG. 8A is a groove 190 for engaging the spring energizer 162, similar to other disclosed embodiments. Interaction with the groove retains the seal member 210 to the housing cavity 130 without the need for added tools or fasteners. The seal member 210 and the groove 190 are arranged for an inside configuration, wherein the inside and outside flanges 152, 154 point in the direction of the bore of the seal member, i.e., in the direction of the base cavity 242. However, the arrangement can reverse and the inside and outside flanges can point away from the base cavity 242 and the groove can be incorporated closer to the exterior of the sidewalls 236, 238.

In an alternative embodiment, the housing groove 130 is incorporated in the top 232 instead of the base. For example, an annular groove may be machined or formed with the top 232 for receiving the seal member 210. In this alternative embodiment, the walls 236, 238 of the base 231 do not incorporate a housing cavity. Although not shown, piping, tubing, and components for connecting them, such as fittings, connectors, and valves, may be connected to the top 232, the base 231, or both to provide fluid, pressure, or vacuum to the cavity 242.

Figure 8B:
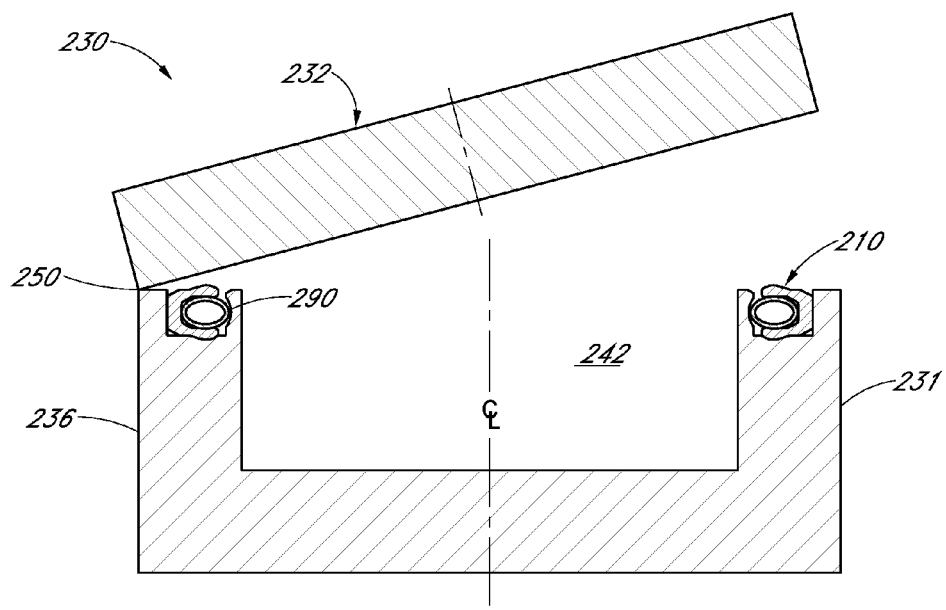

FIG. 8B shows the equipment chamber 230 of FIG. 8A in the open position to expose the base cavity 242. In particular, the top 232 is shown rotated about a line 250 near one of the corners of the sidewall 236. The line 250 can represent a pivoting axis, such as one or more pivot pins of one or more hinges. The line 250 can also represent a living hinge. In other examples, the top can completely separate from the base.

Figure 9:
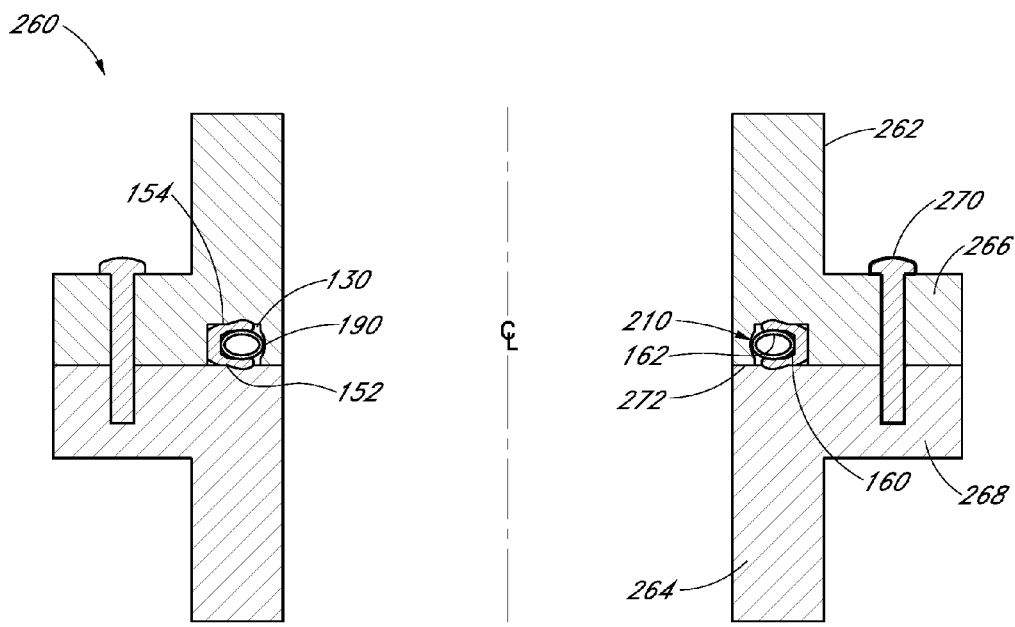
FIG. 9 shows a pipe joint having a seal member in between two mated flanges.

FIG. 9 depicts a pipe joint 260 in which a first pipe section 262 is joined to a second pipe section 264 at their respective flanges 266, 268 sealed along a seam 272 by a plurality of fasteners or bolts 270 and a seal member 210. Although the present embodiment is disclosed with reference to a pipe joint, it is equally applicable to other connections in which two flanges are mated with a seal member, such as a face seal of the present disclosure, located therebetween. In some examples, the pipe joints 262, 264 are separately formed and subsequently welded or threaded to the flanges 266, 268. Further, while the fasteners are shown threaded directly to the second flange 268, the second flange may have a plurality of holes or bores so that a combination nuts and bolts are used to secure the two flanges together instead of just a screw.

As shown, a housing cavity 130 is provided in the first flange 266 for receiving a seal member 210, which in the present embodiment is a face seal having an inside configuration in which the inside and outside flanges 152, 154 point in the direction of the centerline or bore. In other examples, the seal member is a face seal having an outside configuration, in which the inside and outside flanges point away from the centerline or bore. The seal member 210 may be similar to the seal member of FIG. 6 and wherein a spring energizer 162 located in a spring groove 160 engages a groove provided in the housing cavity of the first flange 266. The seal member 210 of the present embodiment is a latchable seal in that an energizer is provided to engage a groove in a housing cavity. The spring energizer 162 biases the inside flange and the outside flange away from one another so that the respective seal lips on the inside and outside flanges are pressed and sealed against the cavity surface and the surface of the second flange.

In another example, the housing cavity 130 is provided in the second flange 268 and not the first flange as shown.

Figure 10:
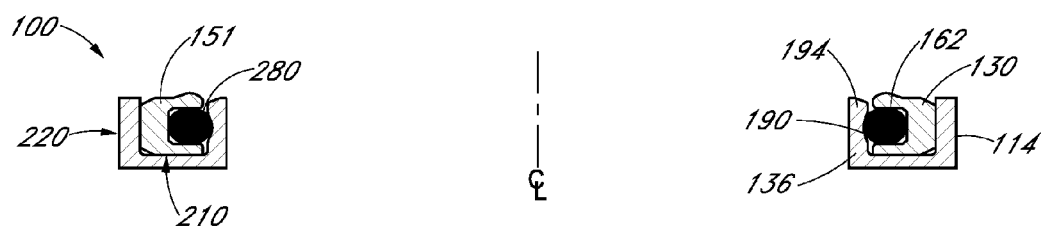
FIG. 10 is a cross-sectional side view of another alternative seal assembly provided in accordance with aspects of the present disclosure.

FIG. 10 shows an alternative seal assembly 100 comprising a seal member 210 located inside a housing cavity 130 of a housing 220, similar to the seal assembly of FIG. 7. However, rather than incorporating a spring energizer in a seal body cavity 160, the present embodiment incorporates an energizer 280 to bias the inside flange 152 and the outside flange 154 away from one another to seal against a surface of the housing cavity 130 and another surface to be sealed by the seal member, such as a plate or a flange. In the present embodiment, the energizer 280 can embody an O-ring, which may optionally be embedded with a spring energizer. The O-ring can be made with from a number of elastomeric materials, including PTF and PTFE.

In the present embodiment, the housing cavity 130 has a groove 190 for mating with the energizer 280 located inside a seal cavity or groove 160 of the seal body 150. The groove 190 is located on an inside surface of inside sidewall 136. More broadly, the groove is located in the housing cavity. The groove 190 may be similar to the grooves discussed elsewhere herein for engaging the energizer 280 in a latching configuration. To facilitate movement and rotation of the energizer 280 deeper into the seal cavity 160 of the seal body, a chamfer 194 is incorporated near the open end of the inside sidewall 136. As shown, the seal member 210 has an inside configuration. In other examples, the seal member 210 has an outside configuration.

Figure 11:
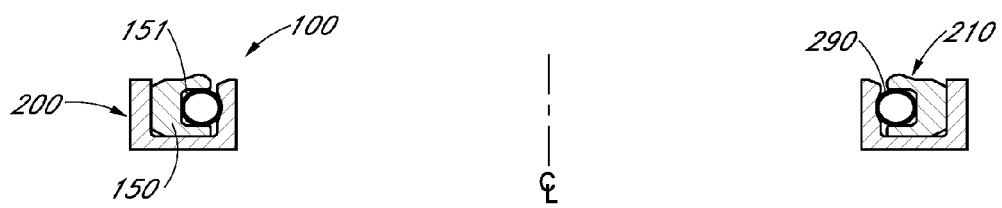
FIG. 11 is a cross-sectional side view of yet another alternative seal assembly provided in accordance with aspects of the present disclosure.

FIG. 11 shows an alternative seal assembly 100 comprising a seal member 210 located inside a housing cavity 130 of a housing 220, similar to the seal assembly of FIGS. 7 and 10. However, rather than incorporating a an energizer 280 to bias the inside flange 152 and the outside flange 154 away from one another to seal against a surface of the housing cavity 130 and another surface to be sealed by the seal member, such as a plate or a flange, the present embodiment incorporates a garter-type helical spring energizer or a ribbon spring energizer 290 that latch with a groove in the housing cavity.

In the present embodiment, the housing cavity 130 has a groove 190 for mating with the spring energizer 290 located inside a seal cavity or groove 160 of the seal body 150. The groove 190 is located on an inside surface of inside sidewall 136. More broadly, the groove is located in the housing cavity. The groove 190 may be similar to the grooves discussed elsewhere herein for engaging the spring energizer 290. To facilitate movement and rotation of the energizer 290 deeper into the seal cavity 160 of the seal body, a chamfer 194 is incorporated near the open end of the inside sidewall 136. As shown, the seal member 210 has an inside configuration. In other examples, the seal member 210 has an outside configuration.

Method of making and method of using the various seal assemblies and seal members disclosed herein are contemplated. Further, while one seal assembly may be discussed with a specific housing, a different seal assembly be used without deviating from the present disclosure. For example, the seal assembly of FIG. 10 may be used in the structure of FIGS. 8A/8B or the pipe joint of FIG. 9.

Although limited embodiments of seal assemblies and their components, such as seal members and assembly bodies have been specifically described and illustrated herein, many modifications and variations will be apparent to those skilled in the art. Accordingly, it is to be understood that the seal assemblies and their components constructed according to principles of the disclosed devices, systems, and methods may be embodied other than as specifically described herein. The disclosure is also defined in the following claims.

What is claimed is:

1. A seal assembly having a bore comprising:
   a sealing member, an energizer, and a housing having sidewalls defining, at least in part, a housing cavity;
   the sealing member is retained in the housing cavity and the sealing member comprises a seal cavity in which the energizer is located;
   a groove formed in the housing cavity having a portion of the energizer located in the groove to retain the sealing member in the housing cavity; and
   wherein the sealing member has a seal body comprising a bore, and the sealing member is a face seal comprising an inside flange and an outside flange pointing in a direction of the bore of the seal body or in a direction away from the bore of the seal body.

2. The seal assembly according to claim 1, wherein the groove is formed on one of the sidewalls and is a V-bottom groove.

3. The seal assembly according to claim 1, wherein the energizer is an annular helical spring, a garter spring, a ribbon spring, a canted coil spring or an O-ring.

4. The seal assembly according to claim 1, wherein the sealing member provides EMI shielding.

5. The seal assembly according to claim 1, wherein the groove is located on an inside sidewall defining at least part of the bore of the seal assembly.

6. The seal assembly according to claim 1, wherein the groove forms a latch or a lock with the energizer.

7. The seal assembly according to claim 1, wherein at least a portion of the sealing member is loaded by the energizer against a surface of the housing cavity.

8. The seal assembly according to claim 1, wherein the sealing member comprises a seal lip that is energized by the energizer.

9. The seal assembly according to claim 1, wherein the sidewall with the groove comprises an entry chamfer for the energizer to rotate.

10. The seal assembly according to claim 9, whereby rotation of the energizer moves the energizer deeper into the spring cavity of the sealing member to allow for full insertion of the sealing member into the housing cavity.

11. The seal assembly according to claim 1, further comprising a second sealing member having a second energizer located in a seal body cavity and wherein the energizer engages a second groove in the housing cavity.

12. A method of assembling a face seal assembly having a bore comprising:
   providing a sealing member having a seal body cavity cooperatively defined by an inside flange, an outside flange, and a center channel section extending therebetween, an energizer, and a housing having sidewalls defining, at least in part, a housing cavity;
   retaining the energizer against the inside flange and the outside flange;
   inserting the sealing member with the energizer into the housing cavity; and
   retaining the sealing member in the housing cavity by positioning a portion of the energizer within a groove formed in the housing cavity.

13. The method according to claim 12, wherein the sealing member is a face seal, and the inside flange points in a direction of a bore or in a direction away from the bore.

14. The method according to claim 12, wherein the groove is a V-bottom groove.

15. The method according to claim 12, wherein the energizer is an annular helical spring, a garter spring, a ribbon spring, an O-ring, or a canted coil spring.

16. The method according to claim 12, wherein the energizer is an axially or a radially oriented canted coil spring.

17. The method according to claim 12, wherein the groove is on a sidewall of the housing cavity closer to a bore than a sidewall further away from the bore.

18. The method according to claim 12, wherein the energizer is held in the groove in a latch or lock configuration.

19. The method according to claim 12, wherein at least a portion of the sealing member is loaded by the energizer against a housing cavity surface.

20. The method according to claim 12, wherein the sealing member comprises a seal lip that is energized by the energizer.

21. The method according to claim 12, further comprising providing a second sealing member having a second energizer located in a seal body groove of the second sealing member and wherein the second energizer engages a second groove in the housing cavity.

22. The method according to claim 12, further comprising rotating the energizer to move the energizer deeper into the seal body cavity.

23. The method according to claim 22, wherein the housing cavity comprises an entry chamfer to allow the energizer to rotate, deflect, and move deeper into the seal body cavity.

24. The method according to claim 23, wherein the sealing member provides EMI shielding.

* * * * *